United States Patent
Seo et al.

(10) Patent No.: US 10,049,616 B2
(45) Date of Patent: Aug. 14, 2018

(54) DISPLAY DEVICE AND METHOD FOR REPAIRING THE SAME

(71) Applicant: Samsung Display Co., Ltd., Yongin-si, Gyeonggi-do (KR)

(72) Inventors: Myeong Hee Seo, Yongin-si (KR); Jun Won Choi, Yongin-si (KR); Min Kyu Woo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 13 days.

(21) Appl. No.: 15/158,444

(22) Filed: May 18, 2016

(65) Prior Publication Data

US 2017/0053591 A1 Feb. 23, 2017

(30) Foreign Application Priority Data

Aug. 21, 2015 (KR) .................. 10-2015-0118210

(51) Int. Cl.
*G09G 3/3225* (2016.01)
*H01L 27/32* (2006.01)

(52) U.S. Cl.
CPC ....... *G09G 3/3225* (2013.01); *H01L 27/3276* (2013.01); *G09G 2300/0413* (2013.01); *G09G 2300/0426* (2013.01); *G09G 2330/08* (2013.01); *G09G 2330/10* (2013.01); *H01L 2251/568* (2013.01)

(58) Field of Classification Search
CPC ............. G09G 3/3225; G09G 2330/08; G09G 2300/0426; G09G 2330/10; G09G 2300/0413; H01L 27/3276
See application file for complete search history.

(56) References Cited

U.S. PATENT DOCUMENTS

| 9,147,723 | B1* | 9/2015 | Lee | G09G 3/006 |
| 2007/0052878 | A1 | 3/2007 | Song et al. | |
| 2012/0280894 | A1 | 11/2012 | Park | |
| 2013/0033469 | A1* | 2/2013 | Itoh | G02F 1/136286 345/204 |
| 2013/0307760 | A1* | 11/2013 | Kim | G09G 3/3208 345/83 |
| 2015/0243214 | A1* | 8/2015 | Jeong | G09G 3/3233 345/214 |
| 2015/0364531 | A1* | 12/2015 | Kim | H01L 27/3276 257/40 |

FOREIGN PATENT DOCUMENTS

| KR | 10-2010-0049385 A | 5/2010 |
| KR | 10-2012-0124222 A | 11/2012 |
| KR | 10-1340602 B1 | 12/2013 |
| KR | 10-1348375 B1 | 12/2013 |

* cited by examiner

*Primary Examiner* — Jay C Chang
*Assistant Examiner* — Charles R Peters
(74) *Attorney, Agent, or Firm* — Lewis Roca Rothgerber Christie LLP

(57) ABSTRACT

A display device includes: a substrate comprising an active area; data lines extending in a first direction in the active area; scan lines extending in a second direction crossing the first direction in the active area; a plurality of repair lines extending in the first direction or in the second direction in the active area; and a multipath power line comprising a plurality of first wires in the active area and crossing the repair lines, and at least one second wire electrically connected to the first wires and extending in the active area to cross the first wires.

14 Claims, 9 Drawing Sheets

DISPLAY DEVICE AND METHOD FOR REPAIRING THE SAME

CROSS-REFERENCE TO RELATED APPLICATIONS

This application claims priority to and the benefit of Korean Patent Application No. 10-2015-0118210 filed on Aug. 21, 2015, in the Korean Intellectual Property Office, the entire content of which is incorporated herein by reference in its entirety.

BACKGROUND

1. Field of the Disclosure

Example embodiments of the present invention relate to a display device and a method for repairing the same. More particularly, the present disclosure relates to a display device capable of repairing a defect generated in an active area of the device and a method for repairing the defect.

2. Description of the Related Art

A display device, such as an organic light emitting display device and a liquid crystal display device, includes an active area in which a plurality of pixels are arranged. The pixels receive a data signal when a scan signal is supplied thereto, and emit light with luminance corresponding to the data signal. As a result, an image corresponding to the data signal is displayed in the active area.

The display device includes scan lines, data lines and switching components formed in the active area.

The above information disclosed in this Background section is only to enhance the understanding of the background of the invention, and therefore it may contain information that does not constitute prior art.

SUMMARY

Example embodiments of the present invention relate to a display device and a method for repairing the same. Some example embodiments of the present invention, a display device may be capable of repairing a defect generated in an active area of the device and a method for repairing the defect.

Embodiments of the present invention include a display device that may be capable of repairing a defect generated in an active area of the device within the active area, and a method for repairing the defect.

According to an embodiment of the present invention, a display device may include: a substrate comprising an active area; data lines extending in a first direction in the active area; scan lines extending in a second direction crossing the first direction in the active area; a plurality of repair lines extending in the first direction or in the second direction in the active area; and a multipath power line comprising a plurality of first wires in the active area and crossing the repair lines, and at least one second wire electrically connected to the first wires and extending in the active area to cross the first wires.

According to some embodiments, the repair lines extend in the second direction, wherein the first wires extend in the first direction, and wherein the at least one second wire extends in the second direction.

According to some embodiments, at least one of the data lines includes a disconnected region and a connection line that connects two opposite edge portions close to the disconnected region.

According to some embodiments, the connection line comprises: a first repair line arranged close to a first end of the disconnected region and crossing the at least one of the data lines; a second repair line arranged close to a second end of the disconnected region and crossing the at least one of the data lines; and a separation pattern separated from a first wire which is most adjacent to the disconnected region among the first wires.

According to some embodiments, the separation pattern is electrically connected to the first repair line and the second repair line at intersections with the first and second repair lines.

According to some embodiments, the multipath power line comprises a plurality of second wires crossing the first wires, and has a mesh shape.

According to some embodiments, the second wire comprises a plate-shaped conductive film that covers the entire active area.

According to some embodiments, the first wires are included in a pattern group different with another pattern group of a layer where the second wire is arranged, and is connected to the second wire at least one of regions overlapped with the second wire through a contact hole.

According to some embodiments, at least one of the data lines comprises a disconnected region, and wherein the disconnected region is repaired using a connection line formed at a same pixel row as the disconnected region.

According to some embodiments, the connection line comprises: a separation pattern separated from one or more first wires arranged close to the disconnected region at the pixel row in which the disconnected region is placed; and one or more repair lines arranged close to the disconnected region and electrically connecting the separation pattern and the data line having the disconnected region.

According to some embodiments, the scan lines are at a first gate layer, and wherein the repair lines are at a second gate layer on the first gate layer.

According to some embodiments, the data lines are at a source/drain layer on the second gate layer.

According to some embodiments of the present invention, in a method for repairing a display device with a disconnection in a signal line extending in a first direction in an active area, the method includes: forming a separation pattern by cutting a portion of a multipath power line that is arranged close to a disconnected region of the signal line; and forming a connection line by electrically connecting one or more repair lines that are arranged close to the disconnected region of the signal line and that cross the separation pattern, to the separation pattern and the signal line with the disconnected region.

According to some embodiments, the multipath power line includes: a plurality of first wires extending in the first direction in parallel with the signal line; and at least one second wire extending in a second direction crossing the first direction, and wherein the repair lines comprise: a first repair line arranged close to a first end of the disconnected region and crossing the signal line and the separation pattern; and a second repair line arranged close to a second end of the disconnected region and crossing the signal line and the separation pattern.

According to some embodiments, forming the connection line comprises connecting the first repair line and the signal line, the first repair line and the separation pattern, the second repair line and the signal line, and the second repair line and the separation pattern, respectively, at their intersections.

According to some embodiments, the signal line crosses the first repair line and the second repair line at both edge portions close to the disconnected region thereof, electrically connecting to the first repair line and the second repair line.

According to some embodiments, forming the separation pattern comprises cutting a portion of the multipath power line so that both edge portions of the separation pattern cross the one or more repair lines.

According to some embodiments of present invention, a connection defect generated in the active area of a display device may be relatively easily repaired within the active area using the repair lines and the multipath power line arranged in the active area.

Thus, the yield of the display device may be enhanced, and image quality may be improved because there may be little or reduced deterioration of image quality due to an RC delay.

BRIEF DESCRIPTION OF THE DRAWINGS

Example embodiments of the present invention will now be described more fully hereinafter with reference to the accompanying drawings; however, the present invention may be embodied in different forms and should not be construed as limited to the embodiments set forth herein. Rather, these embodiments are provided so that this disclosure will be more thorough and more complete and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
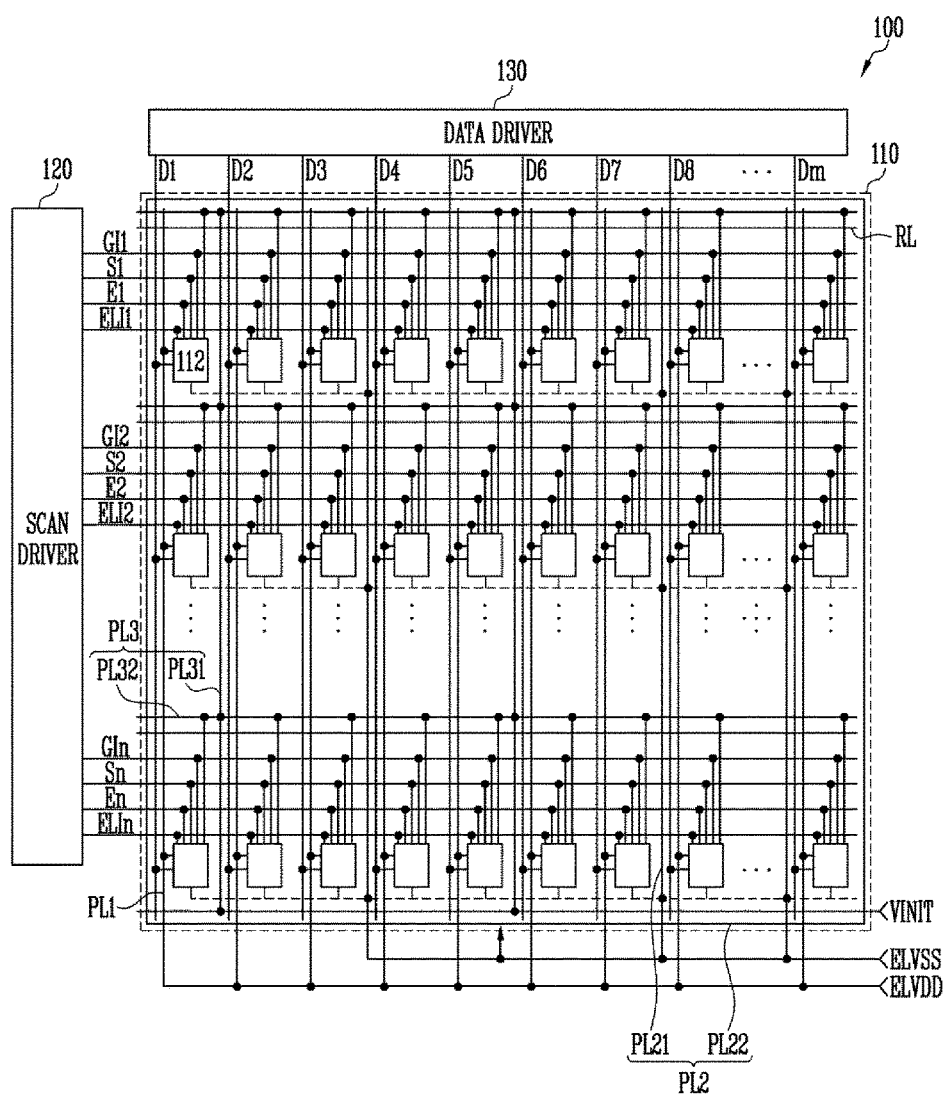
FIG. 1 is a block view of a display device according to an embodiment of the present invention.

The present invention will be described more fully hereinafter with reference to the accompanying drawings, in which embodiments of the present invention are shown. Like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Further, the use of "may" when describing embodiments of the present invention refers to "one or more embodiments of the present invention." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block view of a display device according to an embodiment of the present invention. In this figure, an organic light emitting display device is illustrated as an example of the display device applicable to the present invention. That is, the present invention may be applicable to various display devices.

Referring to FIG. 1, a display device 100 according to the embodiment of the present invention includes an active area 110 with a plurality of pixels 112, and a scan driver 120 and a data driver 130 for driving the pixels 112.

The active area 110 includes scan lines S1 to Sn ("n" is a natural number), data lines D1 to Dm ("m" is a natural number), and the plurality of pixels 112 arranged at every intersection of the scan lines S1 to Sn and the data lines D1 to Dm. As used herein, the term "intersection" when referring to two lines may mean that the two "intersecting" lines cross or overlap one another at a cross point or "intersection," even if the two lines remain electrically isolated from one another. That is, two lines may "intersect" one another if, when viewed from a plan view, they cross or overlap each other, and they may or may not be electrically connected at the crossing point according to the design of the circuit.

Each pixel 112 may include an organic light emitting diode OLED and various type of pixel circuits for driving the organic light emitting diode OLED. Depending on the structure of a pixel circuit, various control lines, such as light emission control lines E1 to En, gate initialization control lines GI1 to GIn and/or EL initialization control lines ELI1 to ELIn, may be additionally formed in the active area 110.

The active area 110 includes first power supply lines PL1 for supplying a first power ELVDD 112 to the pixels 112, and second power supply lines PL2 for supplying a second power ELVSS to the pixels 112. According to the embodiment, at least one of the first power supply lines PL1 and the second power supply lines PL2 may be formed as a conductive layer entirely covering the active area 110, not formed as linear power lines patterned for each horizontal or vertical line.

Depending on the structure of the pixel circuit, third power supply lines PL3 for supplying an initialization power VINIT may be further formed in the active area 110 in addition to the first and second power supply lines PL1 and PL2.

In this case, in the embodiment of the present invention, at least one of the first power supply lines PL1, the second power supply lines PL2, the third power supply lines PL3 may be designed as a multipath power line that supplies a plurality of connection paths. These connection paths are formed in a way that two or more wires arranged at different layers cross and connect with each other within the active area 110.

For example, the second power supply lines PL2 and the third power supply lines PL3 may be designed as the multipath power lines, as shown in FIG. 1.

In the embodiment shown in FIG. 1, the first power supply lines PL1 consist of a plurality of linear wires that extend in a first direction (for example, in a column direction) within the active area 110 and that are arranged in parallel with the data lines D1 to Dm. Each linear wire of the first power supply lines PL1 is connected to each pixel column.

Each of the second and third power supply lines PL2 and PL3 may be designed as the multipath power line including two or more wires arranged at different layers.

The second and third power supply lines PL2 and PL3 designed as the multipath power lines respectively include first wires PL21 and PL31 extending in the first direction within the active area 110 to be parallel to the data lines D1 to Dm. The second and third power supply lines PL2 and PL3 designed as the multipath power lines may further include one or more second wires PL22 and/or PL32 arranged in parallel with the scan lines S1 to Sn and crossing the first wires PL21 and PL31.

In this case, each of the second wires PL22 and PL32 included in the second and third power supply lines PL2 and PL3 may be implemented with a plurality of linear wires crossing the first wires PL21 and PL31, or a single plate-shaped electrode film overlapping the first wires PL21 and PL31. These second wires PL22 and PL32 are formed at the different layers with the first wires PL21 and PL31, each electrically connecting with the first wires PL21 or PL31 through a contact hole to complete the multipath power line.

In the embodiment shown in FIG. 1, each second power supply line PL2 includes a second linear wire PL21 (which may be referred to as the first wire PL21 when describing a structure of the multipath power line) and a second plate-shaped conductive film PL22 (which may be referred to as the second wire when describing the structure of the multipath power line). The second linear wire PL21 extends in the first direction to be parallel with the data lines D1 to Dm, and is formed to correspond to one pixel column. The second plate-shaped conductive film PL22 is formed over the entire active area 110, connected to the second linear wire PL21 through the contact hole. In this structure, the second linear wire PL21 may be the first wire of the multipath power line, while the second plate-shaped conductive film PL22 may be the second wire of the multipath power line.

In the embodiment, each second linear wire PL21 may be formed for every fourth pixel column. Each second plate-shaped conductive film PL22 may be implemented with a cathode electrode of each pixel 112, and the cathode electrodes of the pixels 112 may be integrally patterned within the active area 110.

In this case, even if the second linear wires PL21 are not directly connected to each other, they can be electrically connected all over the active area 110 by the second plate-shaped conductive film PL22. Accordingly, even if a portion of the second linear wires PL21 is disconnected, the second power ELVSS can be normally supplied to the pixels 112.

As described above, the second power supply line PL2 designed as the multipath power line may be completed by additionally forming the second linear wire PL21 together with the second plate-shaped conductive film PL22. If the second power supply line PL2 is completed in this way, resistance of the second power supply line PL2 is reduced, and power consumption of the display device is also reduced by reducing IR drops in a display panel.

Meanwhile, in the embodiment shown in FIG. 1, the third power supply lines PL3 may be designed as the multipath power lines arranged in a mesh shape. For example, each third power supply line PL3 may consist of the third linear wire PL31 of the first direction (which may be referred to as the first wire when describing the structure of the multipath power line) and the third linear wire PL32 of the second direction (which may be referred to as the second wire when describing the structure of the multipath power line). The third linear wire PL31 extends in the first direction to be parallel with the data lines D1 to Dm, while the third linear wire PL32 extends in the second direction to be parallel with the scan lines S1 to Sn. In this case, the third linear wire PL31 of the first direction may be the first wire of the multipath power line, and the third linear wire PL32 of the second direction may be the second wire of the multipath power line.

Each of the third linear wires PL31 of the first direction may be formed to correspond to each pixel column, and each of the third linear wires PL32 of the second direction may be formed to correspond to each pixel row.

Differently, the third linear wires PL31 of the first direction may be respectively formed at every fourth pixel column so that they are alternately arranged with the second linear wires PL21. For example, the third linear wires PL31 of the first direction are formed at every 4I3-th pixel column, and the second linear wires PL21 are formed at every 4I-1-th pixel column.

The display device 100 according to the embodiment of the present invention further includes a plurality of repair lines RL that are formed to be parallel with the scan lines S1 to Sn or the data lines D1 to Dm.

For example, each of the repair lines RL may be formed to cross at least one of wires forming the multipath power lines. For example, each repair line RL may cross at least one of the second linear wires PL21 included in the second power supply lines PL2, and the third linear wires PL31 of the first direction and the third linear wires PL32 of the second direction included in the third power supply lines PL3.

For example, the repair lines RL may be formed in the second direction to be parallel with the scan lines S1 to Sn, as shown in FIG. 1. In this case, the repair lines RL cross the second linear wires PL21 and the third linear wires PL31 of the first direction.

The number of the repair lines RL arranged in the active area 110 may be variously changed. For example, when one or more repair lines RL may be arranged at each pixel row. In this case, black spots can be minimized or reduced and more accurate repair becomes possible.

However, the present invention is not necessarily limited thereto. For example, each of the repair lines RL may be arranged at every two or more pixel rows.

The scan driver 120 generates a scan signal in response to an externally supplied scan control signal, and sequentially supplies the scan signal to the scan lines S1 to Sn.

The scan driver 120 may further generate at least one of light emission control signal, gate initialization control signal, and EL initialization control signal, and may sequentially supply the light emission control signal, gate initialization control signal, and EL initialization control signal to the light emission control lines E1 to En, the gate initialization control lines GI1 to GIn, and the EL initialization control lines ELI1 to ELIn, respectively.

In FIG. 1, the scan driver 120 generating the scan signal, the light emission control signal, the gate initialization control signal, and the EL initialization control signal is illustrated as only one scan driving circuit for ease description, but this scan driver 120 may be divided into two or more driving circuits, for example, a scan driver and an light emission control driver.

In addition, in FIG. 1, the gate initialization control lines GI1 to GIn and the EL initialization control lines ELI1 to ELIn are illustrated as separate lines from the scan lines S1 to Sn. However, at least one of them can be replaced with a Si−1-th scan line Si−1 ("i" is a natural number) or a Si+1-th scan line Si+1.

The data driver 130 generates a data signal in response to data and a data control signal supplied from the outside, and supplies the data signal to the data lines D1 to Dm. The data signal supplied to the data lines D1 to Dm is then supplied to the pixels of the pixel row selected by the scan signal.

The display device 100 according to the embodiment of the present invention includes the repair lines RL formed in the active area 110, and one or more multipath power lines formed in the active area 10. In this embodiment, the multipath power lines may be the second power supply lines PL2 and the third power supply lines PL3.

In this structure, when a defect occurs within the active area 110, it can be easily repaired by using the repair lines RL and the multipath power lines PL2 and PL3 formed in the active area 110.

For example, when a disconnection, a connection defect, or the like occurs in one or more data lines D in the active area 110, it can be repaired within the active area 110 using a linear wire and two repair lines RL arranged close to the data line D with the defect. In this case, the used linear wire may be one of the second linear wires PL21, the third linear wires PL31 of the first direction, and the third linear wires PL32 of the second direction which form the multipath power lines PL2 and PL3.

Thus, the yield of the display device 100 may be enhanced, and image quality may be improved because there is little (or reduced) deterioration of image quality due to an RC delay.

A defect-repairing structure of the display device 100 according to the embodiment of the present invention and a method for repairing the defect will be described later in more detail.

Figure 2:
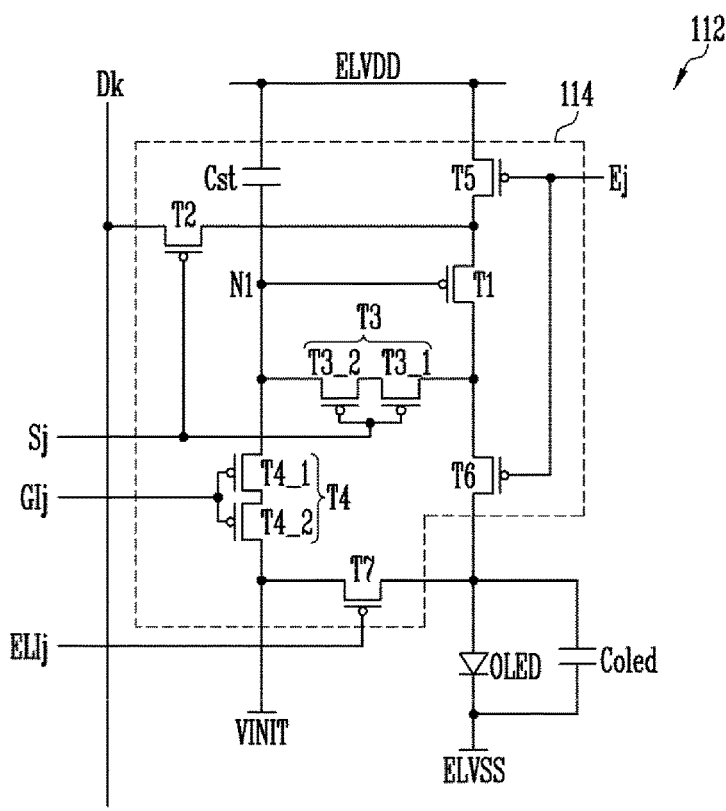
FIG. 2 is a circuit view of a pixel according to the embodiment of the present invention.

FIG. 2 is a circuit view of a pixel according to the embodiment of the present invention. The present invention is not limited to an organic light emitting display device having the pixel structure in FIG. 2. In other words, the pixel structure in FIG. 2 may be variously modified according to various embodiments of the present invention.

Referring to FIG. 2, the pixel 112 according to some embodiments of the present invention includes an organic light emitting diode OLED and a pixel circuit 114 for driving the organic light emitting diode OLED.

An anode electrode of the organic light emitting diode OLED is connected to the pixel circuit 114, and a cathode electrode is connected to a second power ELVSS. When a driving current flows into the pixel circuit, this organic light emitting diode OLED emits light with luminance corresponding to the driving current.

Meanwhile, in FIG. 2, a capacitor Coled connected to the organic light emitting diode OLED in parallel is a parasitic capacitor structurally generated from the organic light emitting diode OLED.

The pixel circuit 114 stores the data signal inputted when the scan signal is supplied, and supplies the driving current corresponding to the data signal to the organic light emitting diode OLED.

For this purpose, the pixel circuit 114 includes seven transistors T1 to T7, and a storage capacitor Cst.

In a first transistor T1, a first electrode is connected to a first power ELVDD via a fifth transistor T5, a second electrode is connected to the organic light emitting diode OLED via a sixth transistor T6, and a gate electrode is connected to a first node N1. The first transistor T1 supplies the driving current corresponding to a voltage of the first node N1 to the organic light emitting diode OLED during a light emission period in which a current path passing the organic light emitting diode OLED is formed.

In a second transistor T2, a first electrode is connected to a k-th data line Dk (k is a natural number) of the corresponding pixel column, a second electrode is connected to the first node N1 via the first transistor T1 and a third transistor T3, and a gate electrode is connected to a j-th scan line Sj (j is a natural number) of the corresponding pixel row. When the scan signal is supplied from the j-th scan line Sj, the second transistor T2 is turned on, thereby transmitting the data signal supplied from the k-th data line Dk to the inside of the pixel circuit 114.

The third transistor T3 is connected between the second electrode of the first transistor T1 and the first node N1. A gate electrode of the third transistor T3 is connected to the j-th scan line Sj of the corresponding pixel row. When the scan signal is supplied from the j-th scan line Sj, the third transistor T3 is turned on, thereby diode-connecting the first transistor T1. The third transistor T3 may be comprised of a pair of transistors T3_1 and T3_2 connected in series between the first node N1 and the second electrode of the first transistor T1. In this case, a leakage current may be effectively blocked.

A fourth transistor T4 is connected between the first node N1 and an initialization power VINIT. A gate electrode of the fourth transistor T4 is connected to a j-th gate initialization control line GIj of the corresponding pixel row. When a gate initialization control signal is supplied to the j-th gate initialization control line GIj, the fourth transistor T4 is turned on, thereby transmitting a voltage of the initialization power VINIT to the first node N1. The fourth transistor T4 may be comprised of a pair of transistors T4_1 and T4_2 connected in series between the first node N1 and the initialization power VINIT. The j-th gate initialization control line GIj may not be designed as a separate control line as shown in FIG. 2, and may be replaced with a j–1-th scan line Sj–1 of the previous pixel row.

A fifth transistor T5 is connected between the first power ELVDD and the first electrode of the first transistor T1. A gate electrode of the fifth transistor T5 is connected to a j-th light emission control line Ej of the corresponding pixel row. When a light emission control signal of high level is supplied from the j-th light emission control line Ej, the fifth transistor T5 is turned off, thereby blocking the driving current to flow into the organic light emitting diode OLED. Meanwhile, if the supply of the light emission control signal stops, in other words, when the voltage level of the light emission control signal is changed to low, the fifth transistor T5 is turned on, thereby electrically connecting the first power ELVDD and the first transistor T1.

A sixth transistor T6 is connected between the second electrode of the first transistor T1 and the organic light emitting diode OLED. A gate electrode of the sixth transistor T6 is connected to the j-th light emission control line Ej of the corresponding pixel row. When the light emission control signal of high level is supplied from the j-th light emission control line Ej, the sixth transistor T6 is turned off, thereby blocking the driving current to flow into the organic light emitting diode OLED. Meanwhile, if the supply of the light emission control signal stops, the sixth transistor T6 is turned on, thereby electrically connecting the first transistor T1 and the organic light emitting diode OLED.

When the fifth and sixth transistors T5 and T6 are turned on, a path of the driving current flowing from the first power ELVDD to the second power ELVSS via the fifth transistor T5, the first transistor T1, the sixth transistor T6, and the organic light emitting diode OLED is formed. In this case, the amount of the driving current is determined according to the voltage of the first node N1 connected to the gate electrode of the first transistor T1.

The seventh transistor T7 is connected between an anode electrode of the organic light emitting diode OLED and the initialization power VINIT. A gate electrode of the seventh transistor T7 is connected to a j-th EL initialization control line ELIj of the corresponding pixel row. When an EL initialization control signal is supplied to the j-th EL initialization control line ELIj, the seventh transistor T7 is turned on, thereby transmitting the voltage of the initialization power VINIT to the anode electrode of the organic light emitting diode OLED. Thus, the voltage of the anode electrode of the organic light emitting diode OLED is initialized.

Figure 3:
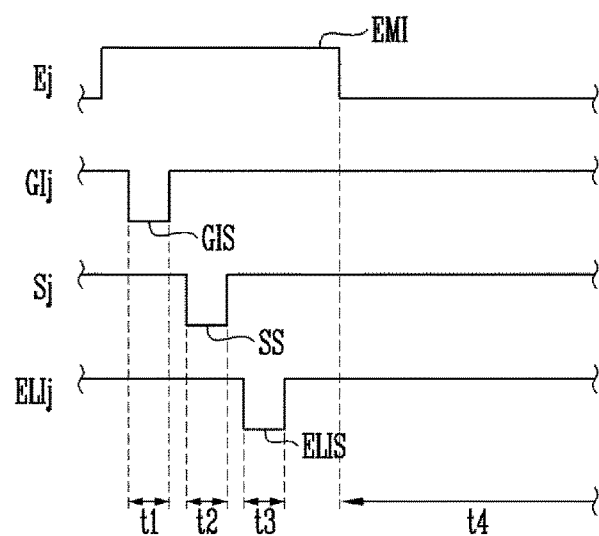
FIG. 3 shows waveforms of driving signals inputted to the pixel of FIG. 2.

FIG. 3 shows waveforms of driving signals inputted to the pixel of FIG. 2. A driving method of the pixel 112 shown in FIG. 2 is now described in detail with reference to FIG. 2 and FIG. 3.

Referring to FIG. 2 and FIG. 3, a gate initialization control signal GIS of low level, a scan signal SS of low level, an EL initialization control signal ELIS of low level are sequentially supplied during the first, second, and third periods t1, t2, and t3. During these periods t1 to t3, a light emission control signal EMI of high level is also supplied. The supply of the light emission control signal EMI stops with the start of the fourth period t4. At this time, the voltage level of the light emission control signal EMI changes to low level. Such a changed level is maintained during the fourth period t4.

For example, while the light emission control signal EMI of high level is supplied from the j-th light emission control line Ej throughout three periods t1 to t3, the fifth and sixth transistors T5 and T6 are turned off. These periods in which the fifth and sixth transistors T5 and T6 are turned off are set as a non-emission period.

During the first period t1, the initial period of the non-emission period, if the gate initialization control signal GIS of low level is supplied to the j-th gate initialization control line GIj, the fourth transistor T4 is turned on, and the voltage of the initialization power VINIT is applied to the first node N1. Thus, the first node N1 is initialized. The voltage of the initialization power VINIT is set enough to initialize the first node N1 so that the first transistor T1 can be forward diode-connected during the next period t2. For example, the voltage of the initialization power VINIT may be set to be lower than the lowest gray voltage among the entire gray voltages of the data signals.

Next, during the second period t2 following the first period t1, if the scan signal SS of low level is supplied to the j-th scan line Sj, the second transistor T2 and the third transistor T3 are turned on.

When the third transistor T3 is turned on, the first transistor T1 is diode-connected, thereby being turned-on.

During the second period t2, the data signal supplied from the k-th data line Dk is transmitted to the first node N1 via the second transistor T2, the first transistor T1, and the third transistor T3. In this case, since the data signal is transmitted to the first node N1 via the first transistor T1 which is diode-connected, the first node N1 receives a voltage after deducting a threshold voltage of the first transistor T1 from the voltage of the data signal.

When the voltage corresponding to the data signal is supplied to the first node N1, the storage capacitor Cst charges the voltage corresponding to a voltage difference of both ends. That is, it charges the voltage corresponding to the data signal and the threshold voltage of the first transistor T1 during the second period t2.

Next, during the third period T3 following the second period t2, if the EL initialization control signal ELIS of low level is supplied to the j-th EL initialization control line ELIj, the seventh transistor T7 is turned on, and the voltage of the initialization power VINT is transmitted to the anode electrode of the organic light emitting diode OLED. Thus, the voltage of the anode electrode of the organic light emitting diode OLED (for example, the anode voltage) is initialized. If the anode voltage is initialized in this manner prior to the light emission period, the entire pixels 114 can uniformly emit light with luminance corresponding to the data signal of the present frame.

Next, after the anode voltage is initialized during the third period t3, the supply of the light emission control signal EMI stops, and thus the voltage level of the j-th light emission control line Ej changes to low level. During the fourth period t4, such a changed voltage level is maintained, and the fifth transistor T5 and the sixth transistor T6 are turned on.

When the fifth transistor T5 and the sixth transistor T6 are turned on, a path of the driving current flowing from the first power ELVDD to the second power ELVSS via the fifth transistor T5, the first transistor T1, the sixth transistor T6, and the organic light emitting diode OLED is formed. At this time, the organic light emitting diode OLED emits light with luminance corresponding to the driving current, and therefore the fourth period t4 is set as the light emission period.

The amount of the driving current flowing into the organic light emitting diode OLED during the fourth period t4 is determined according to the voltage of the first node N1 connected to the gate electrode of the first transistor T1.

In this case, because the voltage corresponding to the threshold voltage of the first transistor T1 together with the data signal has been already stored in the storage capacitor Cst during the second period t2, the effect of the threshold voltage of the first transistor T1 is offset.

Therefore, the light emitting diode OLED can emit light with luminance corresponding to the data signal during the fourth period t4 regardless of the threshold voltage deviation of the first transistor T1 included in the pixel 112. At this time, an image display with uniform display quality becomes possible.

The light emission period of the pixels 112 (for example, the fourth period t4) can continue until the light emission control signal EMI of the next frame is supplied.

Figure 4:
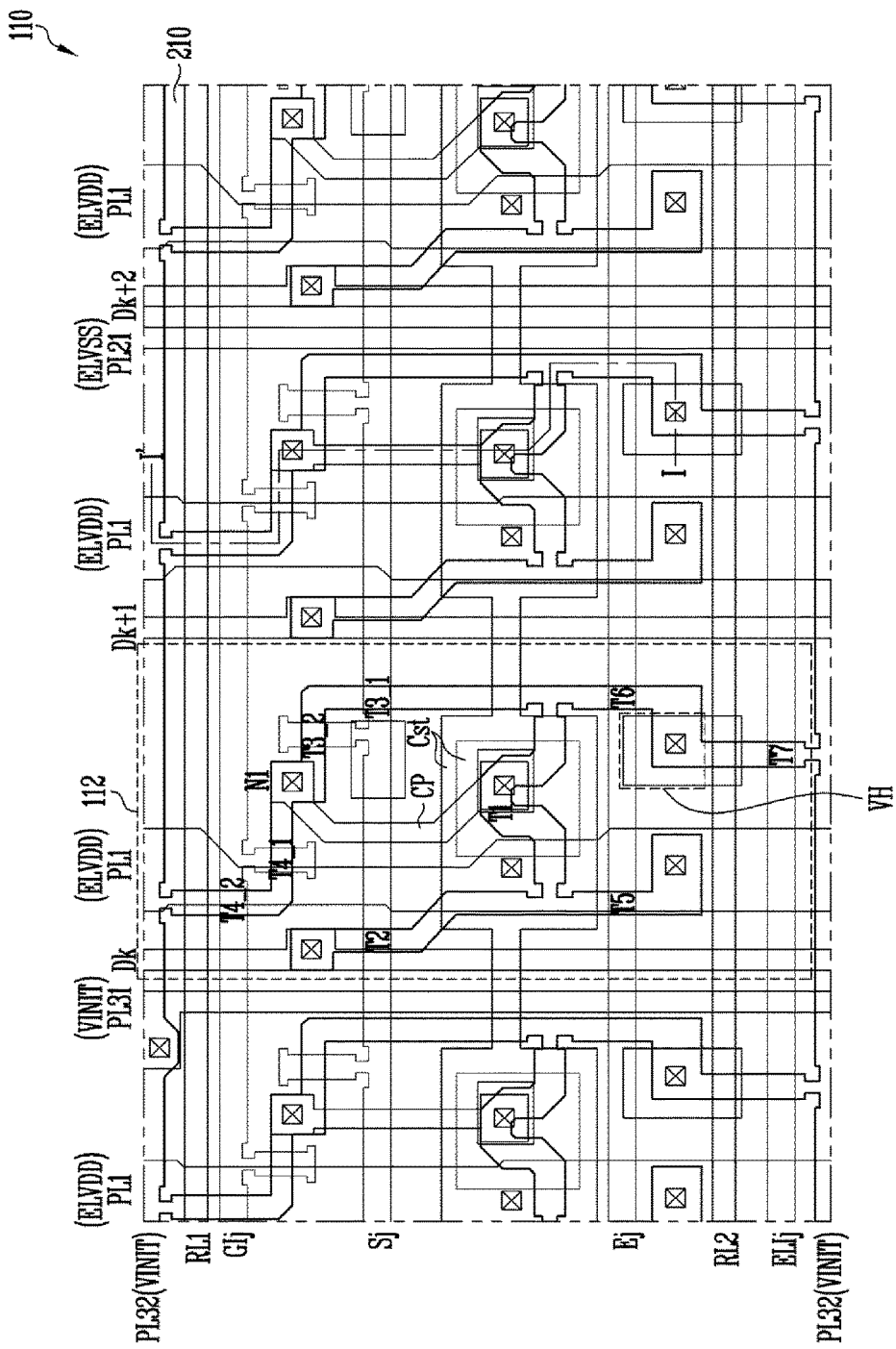
FIG. 4 is a partial plan view of a thin film transistor substrate according to the embodiment of the present invention.
Figure 5:
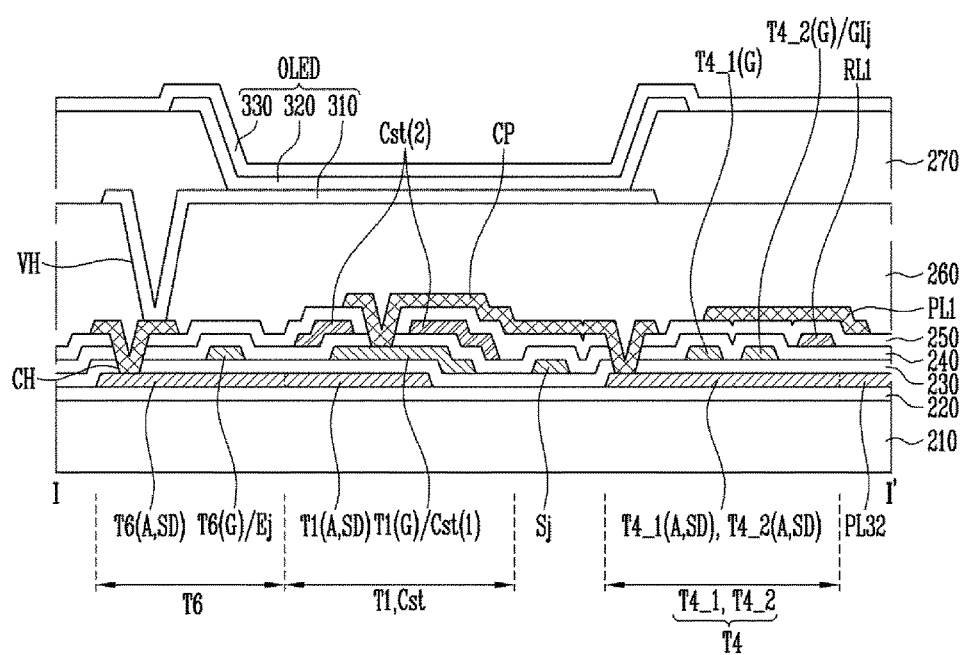
FIG. 5 is a cross-sectional view taken along the line I-I' of FIG. 4.

FIG. 4 is a partial plan view of a thin film transistor substrate according to the embodiment of the present invention. This figure shows a layout structure of the pixels 112, focusing on two pixels arranged in parallel at a k-th pixel column and a k+1-th pixel column on a j-th pixel row for ease of description. FIG. 5 is a cross-sectional view taken along the line I-I' of FIG. 4.

The layout structure of FIG. 4 and FIG. 5 reflects the wiring structure of FIG. 1 and the pixel structure of FIG. 2. Meanwhile, in FIG. 4, because one pixel row (e.g., the j-th pixel row) is merely illustrated, various kinds of lines formed in the second direction are also illustrated merely one by one. However, it is clear that the structure of FIG. 4 may be repeatedly formed throughout the active area 110. Accordingly, the lines of FIG. 4 may also be repeatedly formed throughout the active area 110. Henceforth, various kinds of lines formed in the second direction (for example, Sj, Ej, GIj, etc.) will be represented as plural except when the line formed in the second direction at a specific pixel row should be described. In addition, except when the line formed in the first direction at a specific pixel column or formed in the second direction at a specific pixel row should be described, a representative reference numeral corresponding to the corresponding pixel row or the corresponding pixel column (for example, "S" or "D" instead of "Sj" or "Dk") will be used.

The layout structure of various signal lines, the power lines, and the pixels 112 is now described in detail with reference to FIG. 4 and FIG. 5.

In the active area 110 of the thin film transistor substrate 210, the data lines D are formed in the first direction, each of which is arranged for each pixel column. In the active area 110, the scan lines S are further formed in the second direction crossing the first direction, each of which is arranged for each pixel row.

In addition, the first power lines PL1 are formed in the first direction in parallel with the data lines D, each of which is arranged for each pixel column. The gate initialization control lines GI, the light emission control lines E, and the EL initialization control lines ELI are formed in the second direction in parallel with the scan lines S, each of which is arranged for each pixel row.

In the embodiment of FIG. 4, a pair of repair lines RL1 and RL2 may be formed in the second direction in parallel with the scan lines S, arranged at an upper portion and a lower portion of the corresponding pixel row. That is, the pair of repair lines RL1 and RL2 may be formed for every pixel row in this embodiment. However, the present invention is not necessarily limited thereto. For example, one repair line RL may be arranged to correspond to one pixel row or a plurality of pixel rows. In other words, the number of the repair lines RL to be arranged within the active area 110 may be variously modified.

Meanwhile, the second and third power lines PL2 and PL3 of FIG. 1 may be designed as the multipath power lines as described in the embodiment of FIG. 1.

For example, the second power supply lines PL2 of FIG. 1 may include: the second linear wires PL21 arranged in the first direction to be parallel with the data lines D, each of which is formed to correspond to a plurality of pixel columns (for example, each of which is formed at every fourth column); and the second plate-shaped conductive film PL22 (shown in FIG. 1) connected to the second linear wires PL21. The second plate-shaped conductive film PL22 may be implemented with a cathode electrode 330 of the organic light emitting diode OLED (shown in FIG. 5). Is this way, the second power supply lines PL2 may complete the multipath power lines in which a plurality of wires formed at the different layers are included.

In the case in which the second power supply lines PL2 designed as the multipath power lines are provided, even if one or more second linear wires PL21 are disconnected within the active area 110, the second power ELVSS can be normally supplied to the pixels 112.

Meanwhile, the third power supply lines PL3 of FIG. 1 may be the multipath power lines arranged in a mesh shape. The third power lines PL3 may include the third linear wires PL31 of the first direction and the third linear wires PL32 of the second direction. The third linear wires PL31 of the first direction may be respectively arranged at every fourth pixel column so that they are alternately arranged with the second linear wires PL21, and the third linear wire PL32 of the second direction may be respectively arranged for each pixel row in parallel with the scan lines S.

The third linear wires PL31 of the first direction and the third linear wires PL32 of the second direction are formed at different layers, but they can be electrically connected to each other through contact holes formed at intersections of the third linear wires PL31 and PL32.

In the case in which the third power supply lines PL3 designed as the multipath power lines are provided, even if one or more third linear wires PL31 and/or PL32 are disconnected within the active area 110, the initialization power VINIT can be normally supplied to the pixels 112.

Various signal lines and power supply lines can be divided into four pattern groups based on a layered structure. The signal lines and/or power supply lines included in the same pattern group may be formed as the same layer, and may be formed through the same process with the same material.

For example, the signal lines and power supply lines formed in the first direction and/or the second direction can be divided four pattern groups: a first pattern group formed at a semiconductor layer on the thin film transistor substrate 210; a second pattern group formed at a first gate layer on the semiconductor layer; a third pattern group formed at a second gate layer on the first gate layer; and a fourth pattern group formed at a source drain layer on the second gate layer.

The first pattern group may include the linear wire PL32 of the second direction, and the second pattern group may include the scan lines S, the light emission control lines E, the gate initialization control lines GI, and the EL initialization control lines ELI. The third pattern group may include the repair lines RL, and the fourth pattern group may include the data lines D, the first power supply lines PL1, the linear wires PL21, and the linear wires PL31 of the first direction.

The first pattern group may further include active layers and source/drain electrodes of the transistors T1 to T7 included in the pixels 112. In this case, the active layers, the source/drain electrodes are formed of the same semiconductor material, but through a doping process selectively performed for each region, the active layers functioning as channels of the transistors may be differently formed with the source/drain electrodes functioning as electrodes.

The second pattern group may further include gate electrodes of the transistors T1 to T7 and first electrodes of the storage capacitors Cst.

The third pattern group may further include the other electrodes of the storage capacitors Cst. Second electrodes of the storage capacitors Cst included in the pixels 112 arranged in one pixel row may be integrally patterned.

The fourth pattern group may further include connection patterns CP for electrically connecting some circuit components in each pixel 112. For example, the fourth pattern group may include the connection patterns CP for electrically connecting the first node N1 and electrode patterns of the second pattern group that will be the gate electrode of the transistor T1 and the first electrode of the storage capacitor Cst in each pixel 112.

The layered structure of the four pattern groups will be described below in more detail with reference to FIG. 5. Unmentioned reference numerals in the above are described below.

T1 (A, SD), T4_1 (A, SD), T4_2 (A, SD), T6 (A, SD) are respectively active layers and source/drain electrodes of the first transistor T1, the fourth transistors T4_1 and T4_2, and the sixth transistor T6.

T1 (G), T4_1 (G), T4_2 (G), T6 (G) are respectively gate electrodes of the first transistor T1, the fourth transistors T4_1 and T4_2, and the sixth transistor T6.

Cst (1) and Cst (2) are a first electrode and a second electrode of the storage capacitor Cst.

220 refers to a buffer layer formed on the thin film transistor substrate 210, and 230, 240, and 250 refers to a first insulating layer, a second insulating layer, and a third insulating layers.

260 refers to a planarization layer, and 270 refers to a pixel definition layer.

CH refers to a contact hole penetrating the first insulating layer 230, the second insulating layer 240, and/or the third insulating layers 250, and VH refers to a via hole penetrating the planarization layer 260.

310, 320, and 330 denote an anode electrode, a light emission layer, and a cathode electrode of the organic light emitting diode OLED.

Referring to FIG. 5 together with FIG. 4, positional relationships of the signal lines, the power supply lines, and the circuit components in the pixel 112 will be more clearly understood.

According to the embodiment of the present invention, any defect occurring in the active area 110 may be relatively easily repaired by utilizing the above-mentioned layout structure.

In the embodiment, the first wires PL21 and PL31 are arranged at the different layers with the second wires PL22 (330 of FIG. 5) and PL32. However, the first wires PL21 and PL31 are connected to the second wires PL22 (330 of FIG. 5) and PL32 at one or more regions where they overlap with the second wires PL22 (330 of FIG. 5) and PL32 through the contact holes. In this manner, the second and third power supply lines PL2 and PL3 complete the multipath power lines.

In this embodiment, the repair lines RL1 and RL2 are arranged to cross the first wire PL21 and PL31 of the second and third power supply lines PL2 and PL3 designed as the multipath power lines.

In addition, in the embodiment of the present invention, the repair lines RL1 and RL2 are provided to perpendicularly cross the first wires PL21 and PL31 of the second and third power supply lines PL2 and PL3.

Accordingly, even if a connection defect such as a disconnection occurs in any data line D or the like, such a defect may be relatively easily repaired by cutting at least one of the first wires PL21 and PL31 adjacent (e.g., directly adjacent, close, or nearby) to a disconnected region so as to separate a portion of the first wire from the remaining and by electrically connecting the separated portion to two edge portions of the data line D close to the disconnected region (for example, an upper end and a lower end of the disconnected region) with the repair lines RL1 and RL2.

More detailed description is given below with reference to FIGS. 6A to 6C, FIG. 7 and FIG. 8.

Figure 6A:
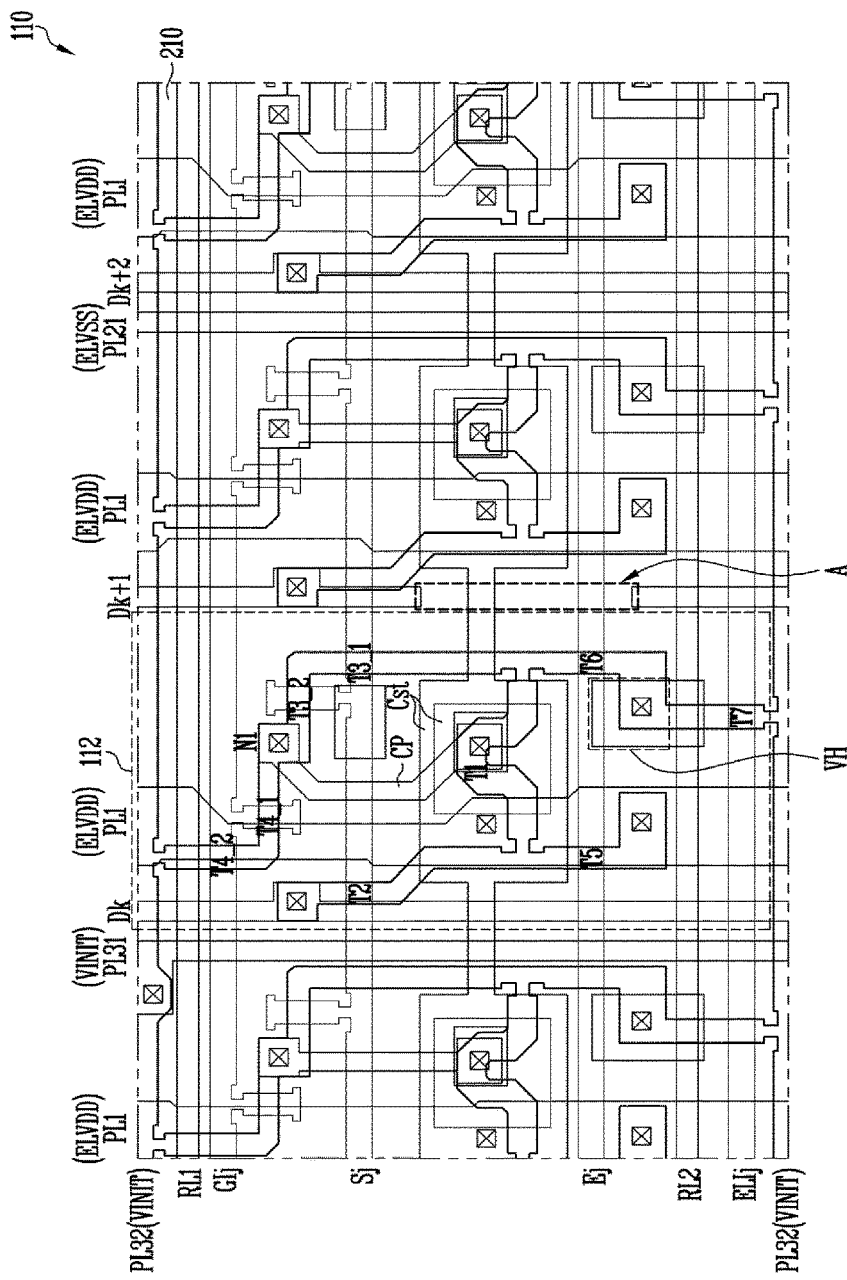
FIGS. 6A to 6C are plan views for illustrating a repair structure and a repair method of the display device according to the embodiment of the present invention.
Figure 6B:
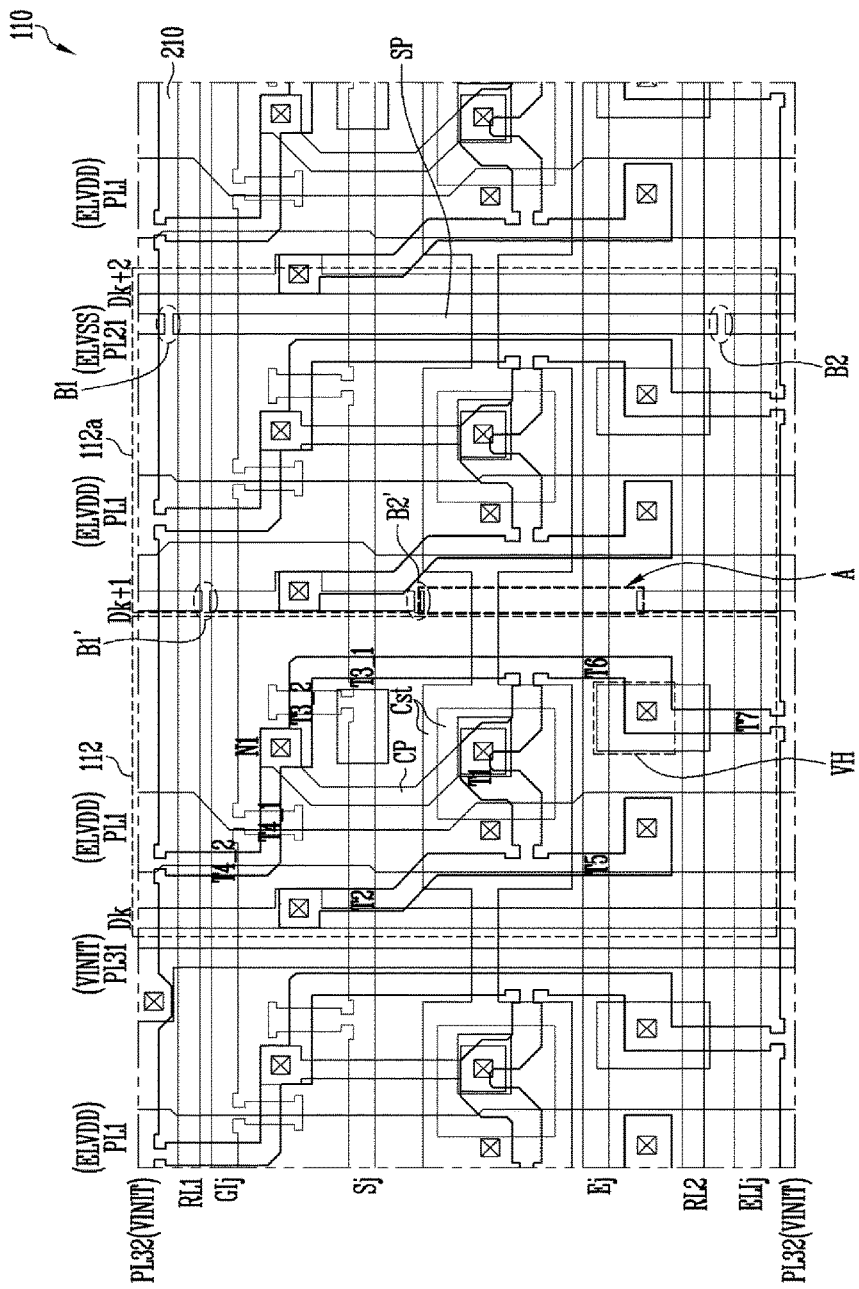
Figure 6C:
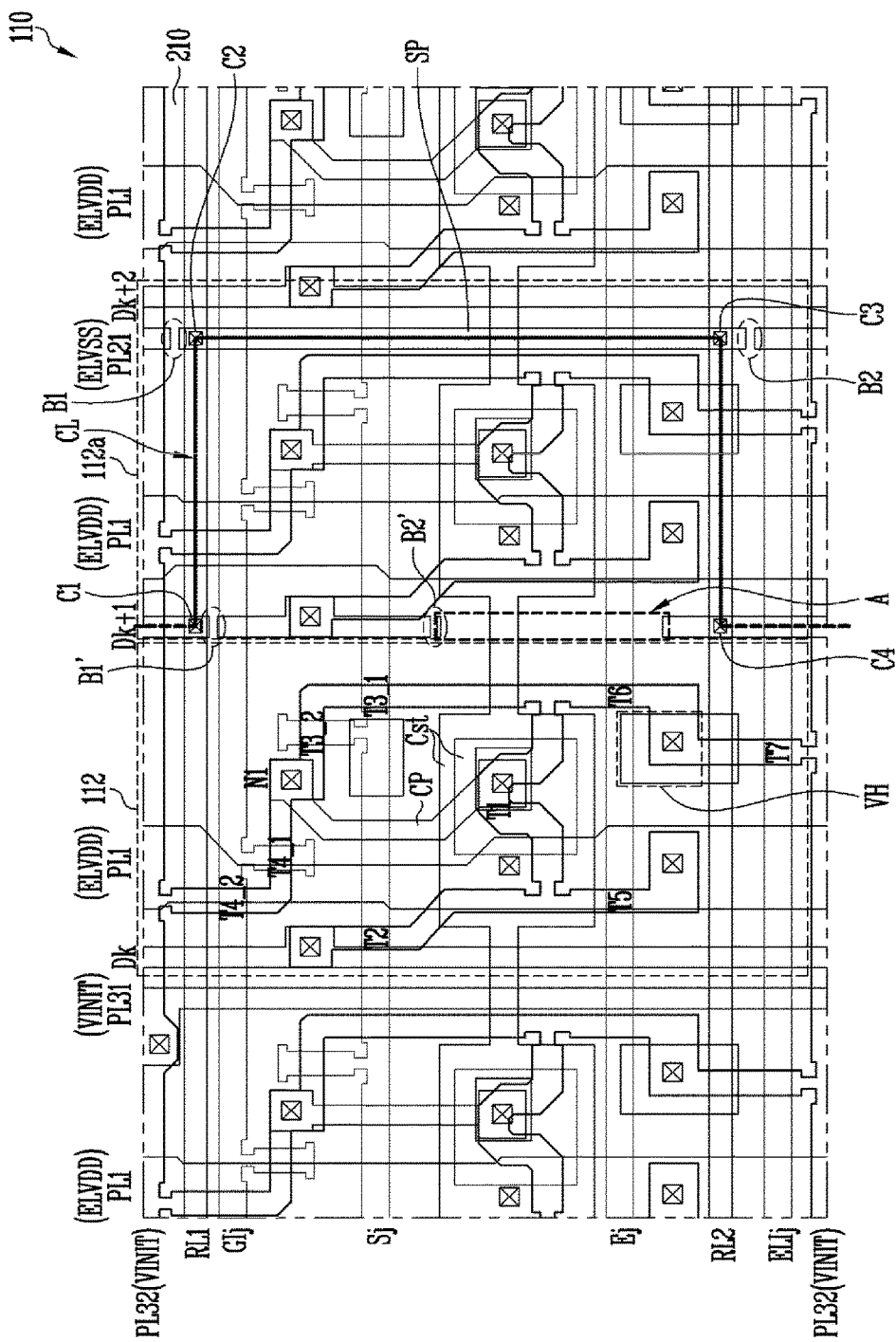

FIGS. 6A to 6C are plan views for illustrating a repair structure and a repair method of the display device according to the embodiment of the present invention. In these figures, an embodiment in which a disconnection of the data line D is repaired by using the second linear wire PL21 arranged close to a disconnected region A is illustrated.

In FIG. 6A, the disconnection generated at the region A of a K+1-th data line Dk+1 arranged in a k+1-th pixel column is found. In this case, the pixel 112 does not receive the data signal due to the disconnected area A, and thus a line defect occurs throughout the k+1-th pixel column.

To repair the disconnection, a portion of the linear wire PL21 adjacent (close) to the disconnected region A is first cut and is separated from the remaining portions of the second linear wire PL21 as shown in FIG. 6B.

In more detail, the second linear wire PL21 is cut at two points B1 and B2 that are positioned above and below intersections of the second linear wire PL21 and the repair lines RL1 and RL2 arranged above and below the disconnected region A.

In brief, the second linear wire PL21 is cut at the two points B1 and B2 close to the intersections of the second linear wire PL21 and the repair lines RL1 and RL2.

Thus, a separation pattern SP is formed as shown in FIG. 6B. Both end portions of the separation pattern SP cross and overlap the repair lines R1 and R2.

The separation pattern SP may be formed in parallel with the disconnected region A within the pixel row where the disconnected region A of the K+1-th data line Dk+1 is placed.

Meanwhile, in the case in which a defect such as an unstable connection different with the disconnection occurs in the K+1-th data line Dk+1, the K+1-th data line Dk+1 may be cut at two points B1' and B2' to prevent a region with the defect from being electrically connected to the corresponding pixel 112a.

To cut the second linear wire PL21 and/or the K+1-th data line Dk+1, a laser cutter may be used.

Next, as shown in FIG. 6C, the K+1-th data line Dk+1 is electrically connected to the repair lines RL1 and RL2 and the separation pattern SP. In detail, a connection process (a shorting process) is performed at two intersections C1 and C4 where the repair lines RL1 and RL2 intersect with two edge portions of the K+1-th data line Dk+1 close to the disconnected region A. The two intersections C1 and C4 may be arranged above and below the disconnected region A. The connection process is also performed at two intersections C2 and C3 where the separation pattern SP separated from the second linear wire PL21 adjacent to the disconnected region A intersect with the repair lines RL1 and the RL2. According to this, the K+1-th data line Dk+1 is electrically connected to the repair lines RL1 and RL2 and the separation pattern SP as shown in FIG. 6C.

In brief, the connection process for forming a connection line CL may be performed at four intersections C1, C2, C3, and C4 to electrically connect the K+1-th data line Dk+1 to the repair lines RL1 and RL2 and the separation pattern SP. In this case, the process may be a welding process using laser beam.

After the process, the K+1-th data line Dk+1 is electrically connected to the pixels 112 arranged on the K+1-th pixel column via the connection line CL. In other words, the K+1-th data line Dk+1 is electrically connected to the pixels 112 arranged on pixel rows above and below the j-th pixel row, on the K+1-th pixel column.

The connection line CL may include: the repair lines RL1 and RL2 that are most closely arranged to the disconnected region A of the K+1-th data line Dk+1, and the separation pattern SP separated from the linear wire PL21 that is most closely arranged to the disconnected region A.

The separation pattern SP may be electrically connected to the repair lines RL1 and RL2 at the intersections C2 and C3, while the repair lines RL1 and RL2 may be electrically connected to the K+1-th data line Dk+1 at the intersections C1 and C4.

The separation pattern SP may be formed by cutting the second linear wire PL21 at slightly extending portions from the intersections C2 and C3 of the linear wire PL21 and the repair lines RL1 and RL2, and thus may be separated from the remaining portions of the second linear wire PL21.

According to the embodiment described above, when the disconnection occurs in the K+1-th data line Dk+1, the connection line CL bypassing the disconnected region A is formed in the same pixel row as the disconnected region A of the K+1-th data line Dk+1.

The connection line CL may include: the separation pattern SP separated from one or more the linear wires PL21 and arranged in the same pixel row as the disconnected region A; and the repair lines RL1 and RL2 closed to a first end (for example, an upper end in the first direction) and a second end (for example, a lower end in the first direction) of the disconnected region A, respectively, and crossing the K+1-th data line Dk+1.

Due to the structure described above, even if the disconnection occurs, only one pixel 112a is expressed in the form of a black spot, and the other pixels arranged in the same pixel column as the pixel 112a can normally receive the data signal.

One black spot may be only a very tiny defect which is difficult to be recognized. As described above, the line defect can be prevented by the connection line CL formed through the repair process. Accordingly, even if any defect occurs, it may be repaired to an extent that does not allow it to be recognized or perceived by viewers.

In this embodiment, the connection lines CL is formed using the repair lines RL1 and RL2 and the second linear wire PL21, but the present invention is not necessarily limited thereto.

For example, if one or more scan lines S are disconnected, the disconnected scan line may be repaired using two or more second linear wires PL21 crossing the scan lines S with the defects, and one repair line RL adjacent (close) to the scan line S.

Meanwhile, an arrangement direction of the repair lines RL is not necessarily limited to the direction parallel to the data lines D. That is, the repair lines RL may be formed in the direction parallel to the scan lines S. In this case, after a portion of a linear wire (that is, one of the first and second wires PL21, PL31, and PL32) crossing the repair line RL that is adjacent to the disconnected region A of the data line D or the scan line S is first cut, a connection line bypassing the disconnected region A of the data line D or the scan line S with the defect may be formed using the repair line RL.

In other words, according to the present invention, when the connection defect such as the disconnection (e.g., an open defect) occurs in the active area 110, the connection line CL forming a bypass is formed using one or more repair lines RL adjacent to the disconnected region A, and a portion of the multipath power lines, for example, a portion of the second power supply lines PL2 and/or the third power supply lines PL3.

In this case, the connection line CL may be formed by selecting a necessary repair line and a multipath power line among the repair lines RL and the multipath power lines PL2 and PL3 depending on a position of the disconnected region A.

In particular, the multipath power line capable of being used as the connection line CL with one or more repair lines RL may be the first wires PL21 and PL31 arranged close to the disconnected region A and crossing the repair lines RL. For example, the second linear wire PL21 which is the closest linear wire to the disconnected region A in the same pixel row as the disconnected region A may be used for the formation of the connection line CL.

According to the repair method described above, the connection defect occurring in the active area 110 (for example, the disconnection of the K+1-th data line Dk+1) can be repaired by forming the connection line CL in the active area 110. As a result, the yield of the display device can be improved. In addition, even after the defect is repaired, the display device can represent prominent image quality without deterioration of image quality due to an RC delay since the connection line CL is formed close to the disconnected region A within the active area 110.

According to the embodiment of the present invention, the connection line CL is formed to be adjacent to the disconnected region A, thereby forming the bypass with a relatively short length. Even after the defect is repaired, image quality of the display device may be as prominent as that of a display device in which the repair line is formed outside the active area 110.

Figure 7:
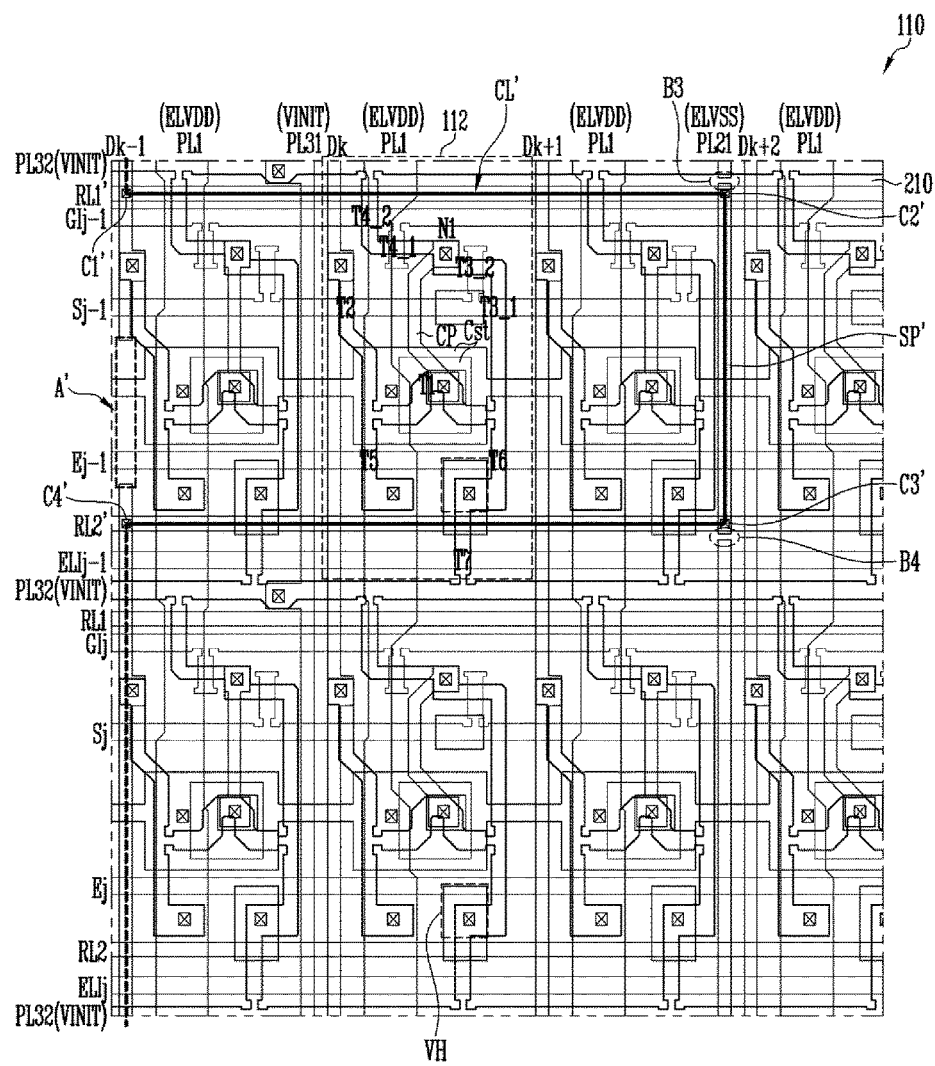
FIG. 7 is a plan view for illustrating a repair structure of a display device according to another embodiment of the present invention.
Figure 8:
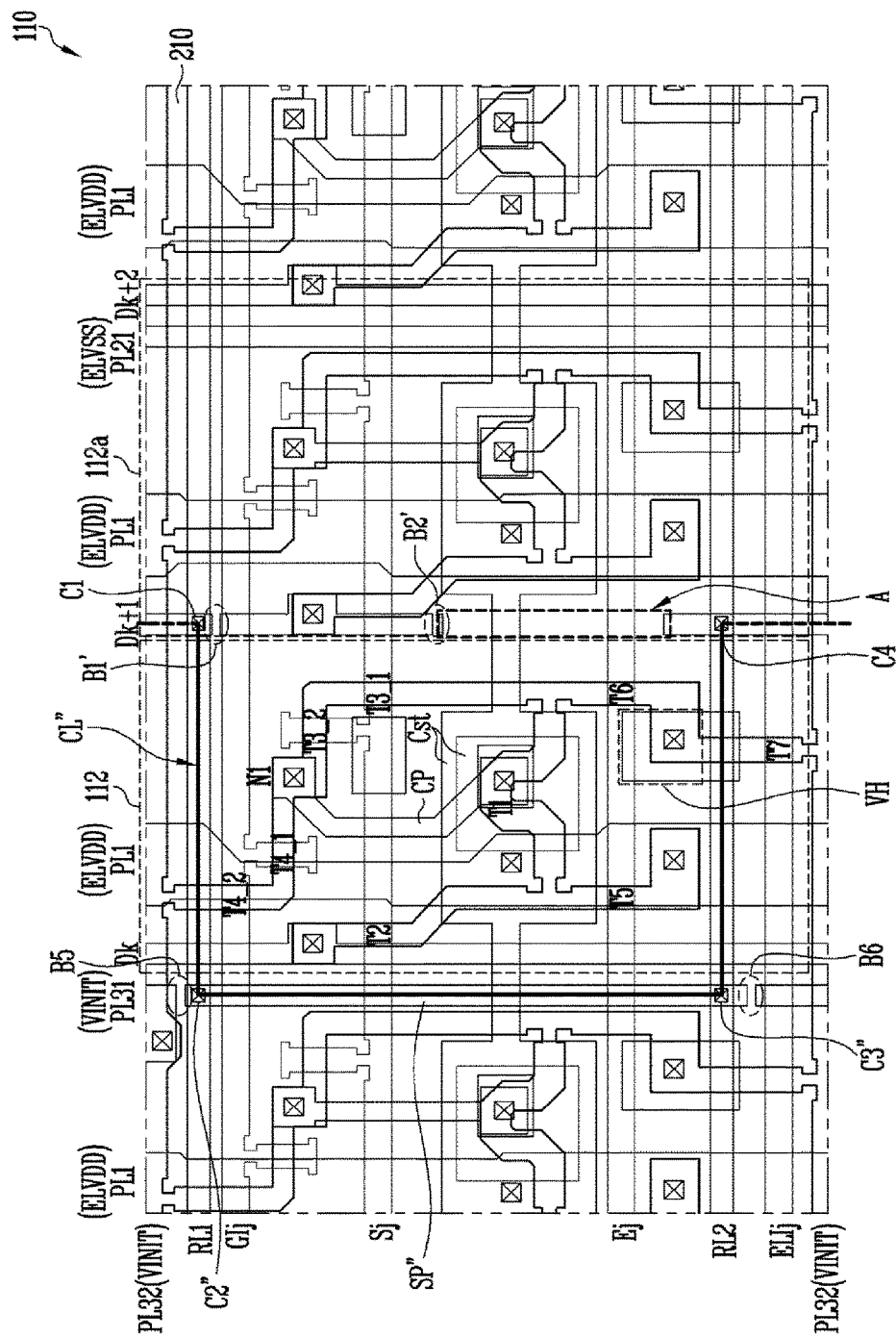
FIG. 8 is a plan view for illustrating a repair structure of a display device according to still another embodiment of the present invention.

FIG. 7 is a plan view for illustrating a repair structure of a display device according to another embodiment of the present invention, and FIG. 8 is a plan view for illustrating a repair structure of a display device according to still another embodiment of the present invention.

In FIG. 7 and FIG. 8, the same or similar components will be denoted by the same or similar reference numerals, and duplicate descriptions thereof will be omitted.

Referring to FIG. 7, the connection line CL' may be changed in its location and length. The selected components, lines, and regions (for example, the second linear wire PL21 and repair line RL1' and RL2', cutting regions B3 and B4, and/or shorted regions C1', C2', C3', and C4' in this embodiment) to form the connection line CL' may be changed depending on a position of the disconnected region A'.

Meanwhile, referring to FIG. 8, when the k+1-th data line Dk+1 is disconnected at the region A (which is the same region as those of FIG. 6A to FIG. 6C), the connection line CL" may be formed using the third linear wire PL31 of the first direction which is arranged close to the disconnected region A, instead of the second linear wire PL21 arranged close to the disconnected region A. In this case, a portion of the third linear wire PL31 of the first direction is separated from the other portions of the third linear wire PL31, thereby forming the separation pattern SP".

For example, the separation pattern SP" is formed by cutting two portions B5 and B6 of the third linear wire PL31 of the first direction arranged in the same pixel row as the disconnected region A. The separation pattern SP" is then connected to the repair lines RL1 and RL2 at the intersections C2" and C3" where the separation pattern SP" meets the repair lines RL1 and RL2, thus completing the connection line CL".

In the present invention, the plurality of repair lines RL are formed in the active area 110 together with various signal lines, such as the scan lines S, the data lines D, etc. In addition, one or more power supply lines (for example, at least one of the second and third power supply lines PL2 and PL3) are designed as the multipath power lines in which the first and second wires PL21, PL22, PL31, and PL32 extending to cross with each other within the active area 110 are included.

Accordingly, even if a connection defect such as a disconnection is generated in one or more signal lines (for example, in the k+1-th data line Dk+1), the connection defect can be easily repaired within the active area 110.

Meanwhile, the present invention may be also applicable to different connection defects such as a short defect.

However, in the case of repairing the short defect, a shorted region is first disconnected so as to separate it from the remaining region, and then disconnected regions that should be electrically connected are repaired using the method described above with reference to FIGS. 6A to 6C and FIG. 7 and FIG. 8. For example, when the k+1-th data line Dk+1 is shorted to the second electrode of the storage capacitor Cst, a shorted region of the k+1-th data line Dk+1 is cut so as to separate it from the remaining region of the k+1-th data line Dk+1, and the shorted region is repaired using one of the methods described above with reference to FIGS. 6A to 6C and FIG. 7 and FIG. 8.

The present invention provides the method for repairing the connection defect generated in the signal line extending in a direction within the active area 110. For example, the disconnection generated in the k+1-th data line Dk+1 can be easily repaired by the present invention.

For example, according to some embodiments of the present invention, the method for repairing the connection defect generated at a region A of the k+1-th data line Dk+1 includes: a step of forming the separation pattern SP, SP', or SP" by cutting a portion of the second or third power line PL2 or PL3 arranged close to the disconnected region A of the k+1-th data line Dk+1, and a step of forming the connection line CL, CL', or CL" by electrically connecting one or more repair lines RL1 and/or RL2 arranged close to the disconnected region A of the k+1-th data line Dk+1 and crossing the separation pattern SP, SP', or SP" to the separation pattern SP, SP', or SP" and the k+1-th data line Dk+1 with the disconnected region A.

In conclusion, according to the present invention, the connection defect may be relatively easily repaired within the active area 110 using the repair lines RL and the multipath power lines, such as the second and/or third power supply lines PL2 and/or PL3 arranged within the active area 110.

Example embodiments have been disclosed herein and although specific terms are employed, they are used and are to be interpreted in a generic and descriptive sense only and not for purpose of limitation. In some examples, as would be apparent to one of ordinary skill in the art as of the filing of the present application, features, characteristics and/or elements described in connection with a particular embodiment may be used singly or in combination with features, characteristics and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. A display device comprising:
    a substrate comprising an active area;
    data lines extending in a first direction in the active area;
    scan lines extending in a second direction crossing the first direction in the active area;
    a plurality of repair lines extending in the first direction or in the second direction in the active area; and
    a multipath power line comprising a plurality of first wires in the active area and crossing the repair lines, and at least one second wire electrically connected to the first wires and extending in the active area to cross the first wires,
    wherein the repair lines extend in the second direction, wherein the first wires extend in the first direction, and wherein the at least one second wire extends in the second direction, and
    wherein at least one of the data lines includes a disconnected region and a connection line that connects two opposite edge portions close to the disconnected region.

2. The display device of claim 1 wherein the connection line comprises:

a first repair line arranged close to a first end of the disconnected region and crossing the at least one of the data lines;

a second repair line arranged close to a second end of the disconnected region and crossing the at least one of the data lines; and a separation pattern separated from a first wire which is most adjacent to the disconnected region among the first wires.

3. The display device of claim 2, wherein the separation pattern is electrically connected to the first repair line and the second repair line at intersections with the first and second repair lines.

4. The display device of claim 1, wherein the multipath power line comprises a plurality of second wires crossing the first wires, and has a mesh shape.

5. The display device of claim 1, wherein the second wire comprises a plate-shaped conductive film that covers an entirety of the active area.

6. The display device of claim 1, wherein the first wires are included in a pattern group different with another pattern group of a layer where the second wire is arranged, and is connected to the second wire at least one of regions overlapped with the second wire through a contact hole.

7. The display device of claim 1, wherein at least one of the data lines comprises a disconnected region, and wherein the disconnected region is repaired using a connection line formed at a same pixel row as the disconnected region.

8. The display device of claim 7, wherein the connection line comprises:

a separation pattern separated from one or more first wires arranged close to the disconnected region at the pixel row in which the disconnected region is placed; and one or more repair lines arranged close to the disconnected region and electrically connecting the separation pattern and the data line having the disconnected region.

9. The display device of claim 1, wherein the scan lines are at a first gate layer, and wherein the repair lines are at a second gate layer on the first gate layer.

10. The display device of claim 9, wherein the data lines are at a source/drain layer on the second gate layer.

11. A method for repairing a display device with a disconnection in a signal line extending in a first direction in an active area, the method comprising:

forming a separation pattern by cutting a portion of a multipath power line that is arranged close to a disconnected region of the signal line; and forming a connection line by electrically connecting one or more repair lines that are arranged close to the disconnected region of the signal line and that cross the separation pattern, to the separation pattern and the signal line with the disconnected region, wherein the multipath power line comprises:

a plurality of first wires extending in the first direction in parallel with the signal line; and at least one second wire extending in a second direction crossing the first direction, and wherein the repair lines comprise:

a first repair line arranged close to a first end of the disconnected region and crossing the signal line and the separation pattern; and a second repair line arranged close to a second end of the disconnected region and crossing the signal line and the separation pattern.

12. The method of claim 11 wherein forming the connection line comprises connecting the first repair line and the signal line, the first repair line and the separation pattern, the second repair line and the signal line, and the second repair line and the separation pattern, respectively, at their intersections.

13. The method of claim 12, wherein the signal line crosses the first repair line and the second repair line at both edge portions close to the disconnected region thereof, electrically connecting to the first repair line and the second repair line.

14. The method of claim 11, wherein forming the separation pattern comprises cutting a portion of the multipath power line so that both edge portions of the separation pattern cross the one or more repair lines.

* * * * *